United States Patent [19]
Manning

[11] Patent Number: 5,212,399
[45] Date of Patent: May 18, 1993

[54] LOW COST POLYSILICON ACTIVE P-CHANNEL LOAD

[75] Inventor: Monte Manning, Kuna, Id.

[73] Assignee: Micron Technology, Inc., Boise, Id.

[21] Appl. No.: 746,274

[22] Filed: Aug. 15, 1991

[51] Int. Cl.$^5$ .................. H01L 29/76; H01L 29/04; H01L 27/11
[52] U.S. Cl. .................. 257/369; 257/66; 257/903
[58] Field of Search .......... 357/23.5, 23.7, 42, 357/59 F; 257/369, 66, 903

[56] References Cited

U.S. PATENT DOCUMENTS

| | | | |
|---|---|---|---|
| 4,656,731 | 4/1987 | Lam et al. | 357/23.4 |
| 4,667,217 | 5/1987 | Janning | 357/23.5 |
| 4,814,841 | 3/1989 | Masuoka et al. | 357/42 |
| 4,907,059 | 3/1990 | Kobayashi et al. | 357/42 |
| 4,980,732 | 12/1990 | Okazawa | 357/23.5 |
| 4,994,873 | 2/1991 | Madan | 357/23.5 |
| 4,999,691 | 3/1991 | Hsu et al. | 357/42 |
| 5,057,898 | 10/1991 | Adan et al. | 357/42 |
| 5,128,731 | 7/1992 | Lien et al. | 357/23.5 |
| 5,144,391 | 9/1992 | Iwata et al. | 357/23.7 |

FOREIGN PATENT DOCUMENTS

| | | | |
|---|---|---|---|
| 63-53965 | 3/1988 | Japan | 357/42 |
| 63-104374 | 5/1988 | Japan | 357/42 |
| 2-260654 | 10/1990 | Japan | 357/42 |

OTHER PUBLICATIONS

IEEE Transaction on Electron Devices, vol. ED-29, No. 4, Apr. 1982, "Stacked Transistors CMOS (ST-MOS), an NMOS Technology Modified to CMOS" by Colinge et al., pp. 585-589.
IEEE Electron Device Letters, vol. EDL-4, No. 8, Aug. 1983, "Stacked CMOS SRAM Cell" by Chen et al., pp. 272-274.

*Primary Examiner*—Rolf Hille
*Assistant Examiner*—Steven Loke
*Attorney, Agent, or Firm*—David J. Paul

[57] ABSTRACT

A low cost active P-channel load for use in semiconductor devices is developed. The active P-channel load may be used in a variety of designs, such as functioning as a pullup device in integrated circuits and more specifically for use as a pullup resistor in SRAM devices. The P-channel load is built overlying an active NMOS device and not only takes up less die space but also allows for a simple process to construct the P-channel load. This P-channel device is easily incorporated into an SRAM process flow to build an SRAM cell made up of active NMOS devices that utilize the P-channel devices as pullups.

15 Claims, 7 Drawing Sheets

LOW COST POLYSILICON ACTIVE P-CHANNEL LOAD

FIELD OF THE INVENTION

This invention relates to semiconductor devices and more particularly to a process to fabricate a low cost polysilicon active P-channel load that may be used in devices such as Static Random Access Memories (SRAMs).

BACKGROUND OF THE INVENTION

One of the common elements required in electrical circuit devices is the simple pullup (or pulldown device) from an active device to one of the power supply buses. The pullup is simple if used to construct a circuit using discrete components in that all that is required is selecting a resistor of the desired resistance and tolerance, connecting it between an active device, such as an open collector transistor, and $V_{cc}$ and the transistor's output would be pulled up to $V_{cc}$ once the transistor is forward biased. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4 Kb memory arrays to more densely packed array sizes, tolerances of pullup resistances (or pullup loads) had to be tightly controlled. In order to minimize standby current many fabrication processes adopted using an active device as the pullup. In CMOS fabrication it is common to see a PMOS transistor acting an active load device, by providing a current path between a memory cell access transistor and the power supply bus. In this manner the PMOS transistor could be gated on only when the desired line was to be pulled to $V_{cc}$ and turned off otherwise, thereby virtually eliminating leakage current and minimizing standby current for the SRAM device as a whole.

Conventional methods to fabricate active pullup devices are expensive, such as is the method of fabricating a PMOS pullup by the use of selective epitaxially grown silicon (EPI). Using EPI requires a tightly controlled process method that requires two levels of polysilicon and two interconnects to form the PMOS transistor. As the SRAM generation continues to grow, cost becomes an even more critical factor that must be taken into account in order to produce competitively priced parts.

The present invention introduces a method to fabricate an active pullup P-channel device fabricated on top of an SRAM's NMOS storage cell transistor thereby using a common gate electrode between the two devices. This fabrication technique provides for a less expensive method to form an active load than do conventional fabrication processes.

SUMMARY OF THE INVENTION

The invention is directed to an active P-channel load and a process for fabricating the same. The active P-channel load device may be used as an active pullup device in integrated circuits and more specifically for use as a pullup in SRAM devices.

The active P-channel load of the present invention employs a low-cost method of manufacturing it, thus making it highly attractive for use in SRAM production.

DETAILED DESCRIPTION OF THE PREFERRED EMBODIMENT

A first embodiment of the present invention is directed to a process for fabricating a low cost active P-channel load (or pullup). As a second embodiment and for sake of illustration, the process steps are integrated into a conventional SRAM fabrication process to form an active P-channel pullup to an SRAM storage cell. The process to develop the SRAM active P-channel pullup is described in a sequence shown in composite cross-sectional views of FIGS. 1–7b showing all features of the SRAM cell during fabrication. FIGS. 1, 2a, 3a, 4a, 5a, 6a and 7a illustrate the process steps to develop the present invention, while FIGS. 2b, 3b, 4b, 5b, 6b and 7b illustrate the formation of a self-aligned buried contact (corresponding to the same process steps preformed in FIGS. 2a-7a) used to coupled the present invention to an adjacent active P-channel pullup thereby forming an SRAM storage cell.

Figure 1:
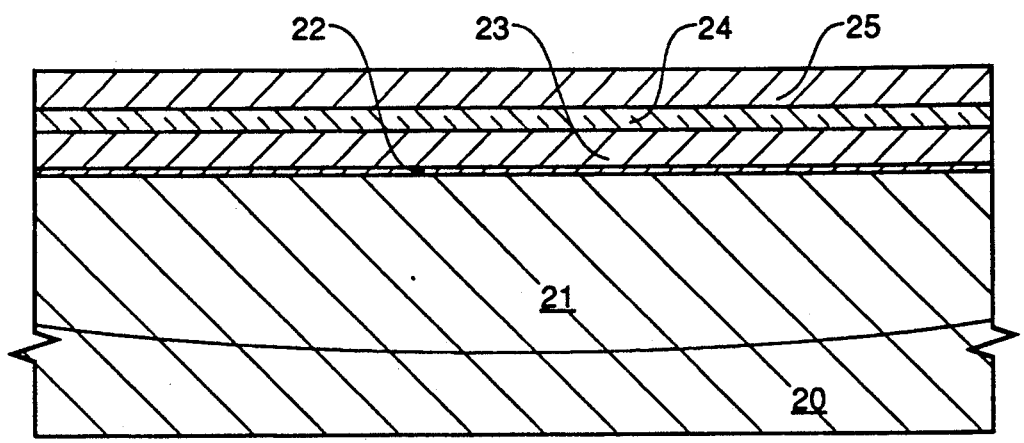
FIG. 1 is a composite cross-sectional view of an in-process wafer portion after formation of a standard MOS gate oxide followed by formation of conformal layers of poly, oxide and poly, respectively.

As shown in FIG. 1, a silicon wafer is fabricated using conventional process steps, known to one skilled in the art, up to the point of having formed a p-well region 21 into wafer substrate 20. A layer of thin oxide has been grown to be used as gate oxide 22 to an NMOS active device to be completed later in the process. Next a layer of polysilicon (or poly) 23 is deposited and doped to n-type conductivity, followed by formation of high quality oxide 24 (by growing or depositing) having good dielectric integrity, low defect density and good reliability to high field stress. Next polysilicon layer 25 is deposited then lightly doped to an n-type conductivity.

Figure 2A:
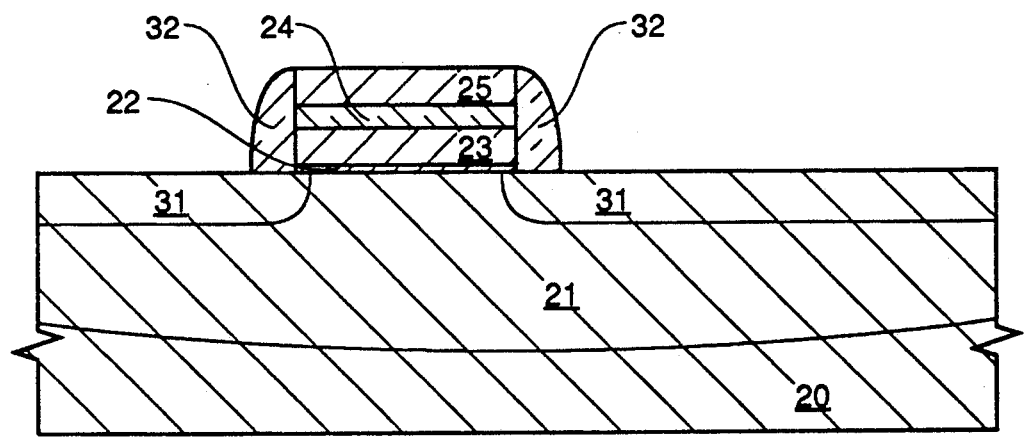
FIG. 2a shows a cross-sectional view of the in-process wafer portion of FIG. 1 after patterning and etching of the poly/oxide/poly layers, formation of diffusion regions (or active areas), followed by formation of oxide spacers.
Figure 2B:
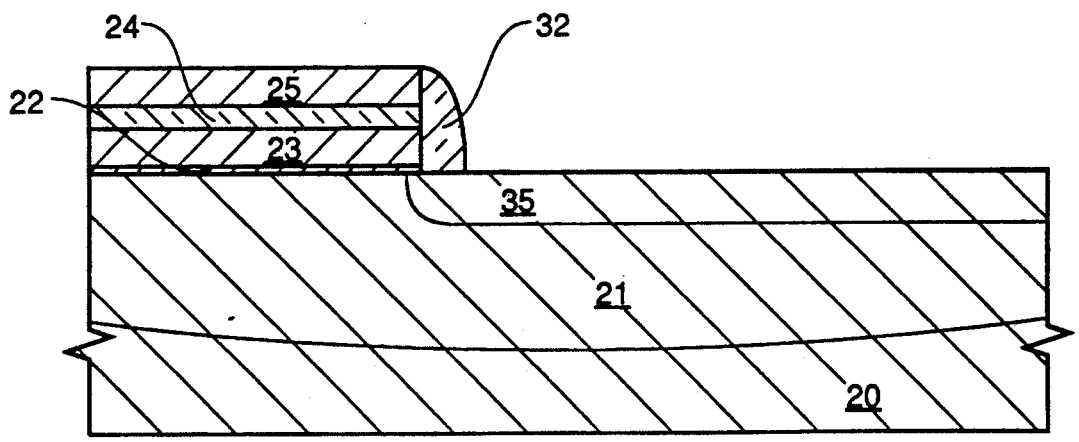
FIG. 2b is a composite cross-sectional view showing an in-process wafer portion corresponding to the steps performed in FIG. 2a prior to formation of a self-aligned buried contact.

Referring now to FIGS. 2a and 2b, poly layer 23, oxide layer 24 and poly layer 25 have been patterned directly overlying gate oxide 22 and N+diffusion regions 31 have been implanted into p-well region 21. Poly gate 23 and gate insulative oxide 22 bridge the desired diffusion regions 31 and form an NMOS active device to an SRAM storage cell. As part of the present invention, oxide 24 will serve as a gate oxide between poly 25, which will become the channel region to a P-channel device (to be completed later in the process) and NMOS poly gate 23. A dielectric is then deposited and etched to form dielectric spacers 32.

Figure 3A:
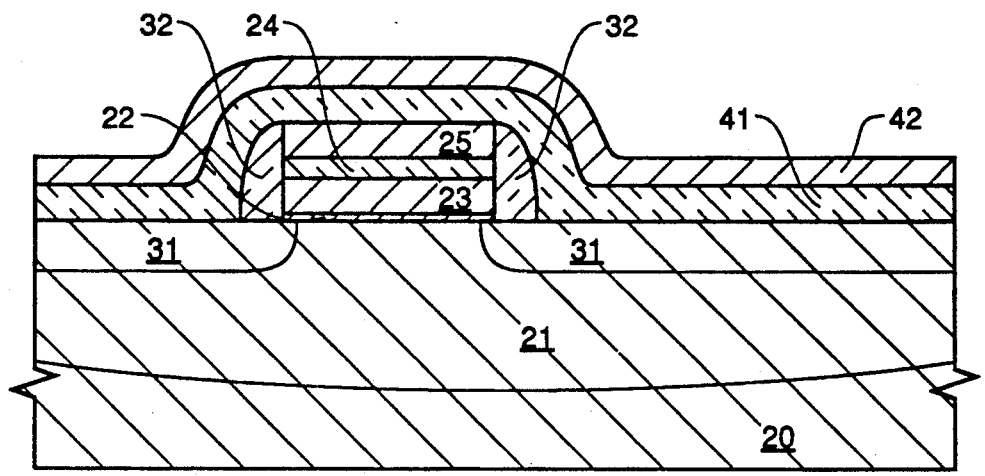
FIGS. 3a and 3b show cross-sectional views of the in-process wafer portion of FIGS. 2a and 2b, respectively, after formation of thick oxide layer followed by deposition of conformal poly.
Figure 3B:
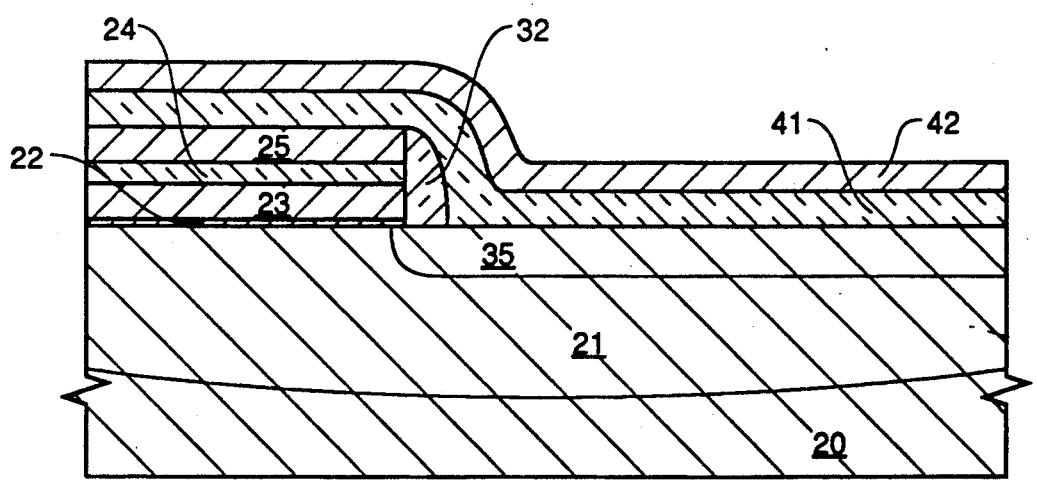

Referring now to FIGS. 3a and 3b, a layer of isolation oxide 41, preferably 1500Å thick, is deposited over the existing wafer surface illustrated in FIGS. 2a and 2b. Next a conformal layer of polysilicon 42 is deposited and doped to a p-type conductivity using high dose implantation.

Figure 4A:
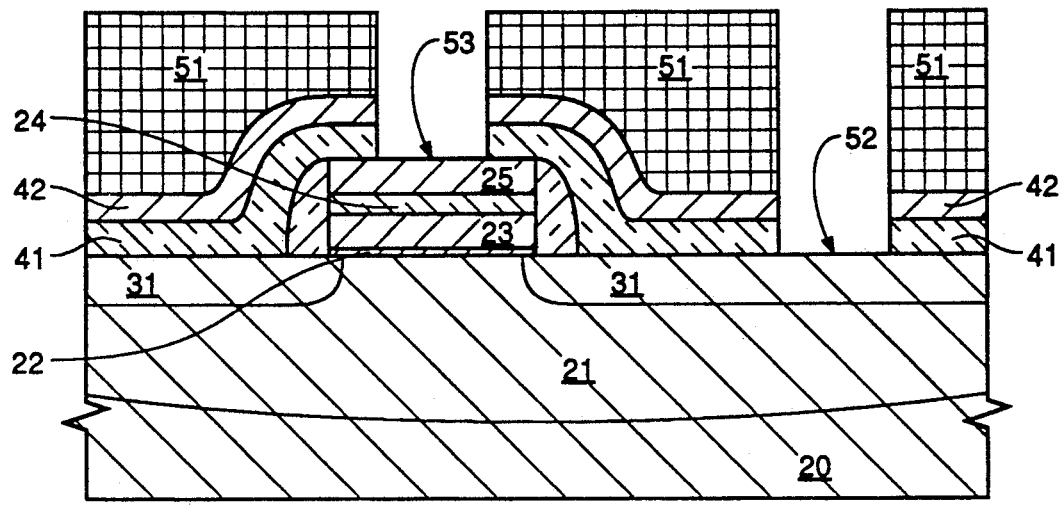
FIG. 4a shows a cross-sectional view of the in-process wafer portion of FIG. 3a after a photomask/etch step to open areas for contacts to an implanted active area in the silicon substrate as well as to a PMOS gate poly.
Figure 4B:
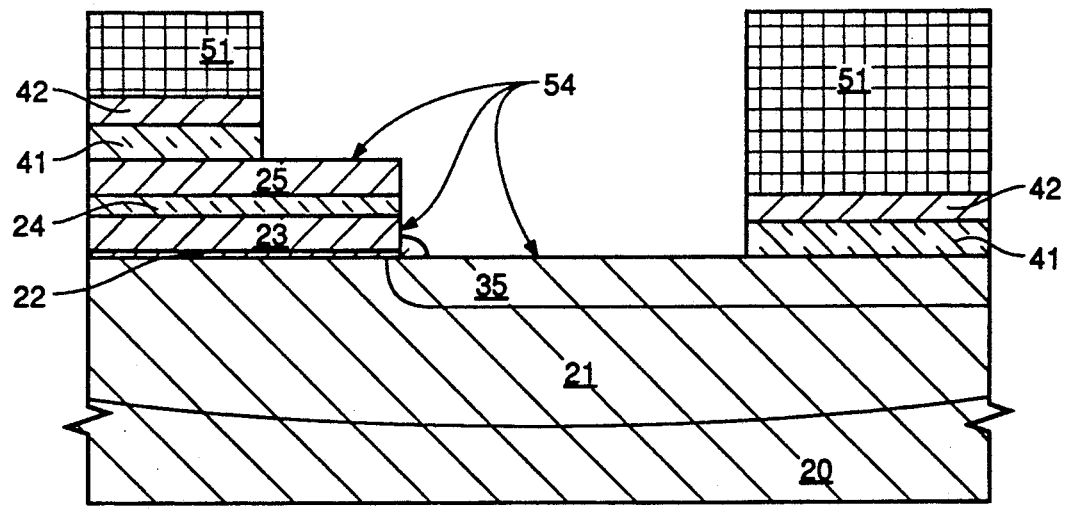
FIG. 4b shows a cross-sectional view of the in-process wafer portion of FIG. 3b after a photomask/etch step to open areas for contacts to an implanted active area in the silicon substrate to the NMOS gate poly.

Referring now to FIGS. 4a and 4b, poly 42 is covered with photoresist 51 and an appropriate photomask is used to form buried contact locations 52, 53 and 54, following an anisotropic etch. Buried contact location 52 allows access to the appropriate N+ diffusion region 31, while buried contact location 53 allows access to P-channel poly 25 (both contacts seen in FIG. 3a). Buried contact location 54 (seen in FIG. 3b) allows access to diffusion region 35 as well as NMOS gate poly 23 and P-channel poly 25. The etch performed to open buried contact location 54 must be sufficient to reduce oxide spacer 32 enough to expose a major portion of gate poly 23 in preparation to the following steps.

Figure 5A:
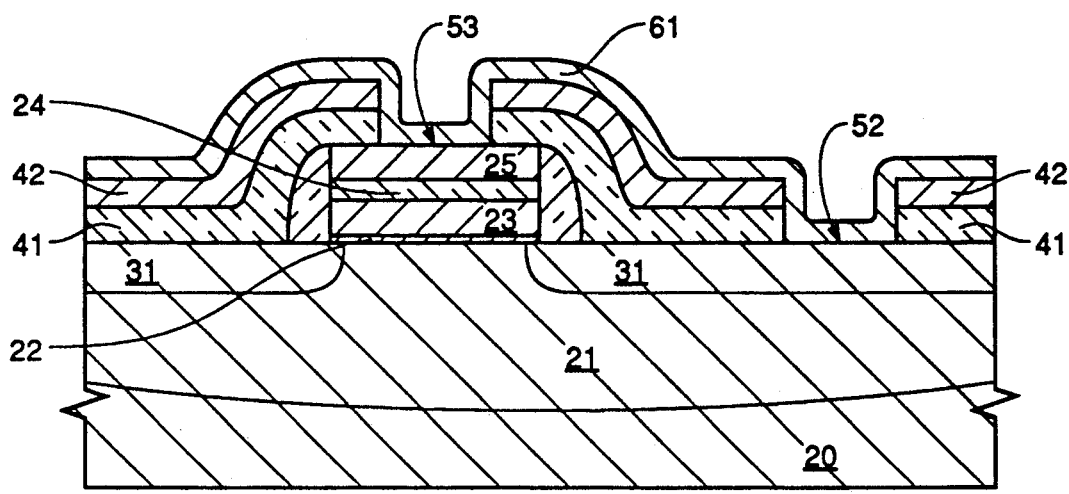
FIGS. 5a and 5b show cross-sectional views of the in-process wafer portion of FIGS. 4a and 4b, respectively after depositing a layer of polysilicon followed by annealing steps to form contacts at areas opened by the previous photo/etch.
Figure 5B:
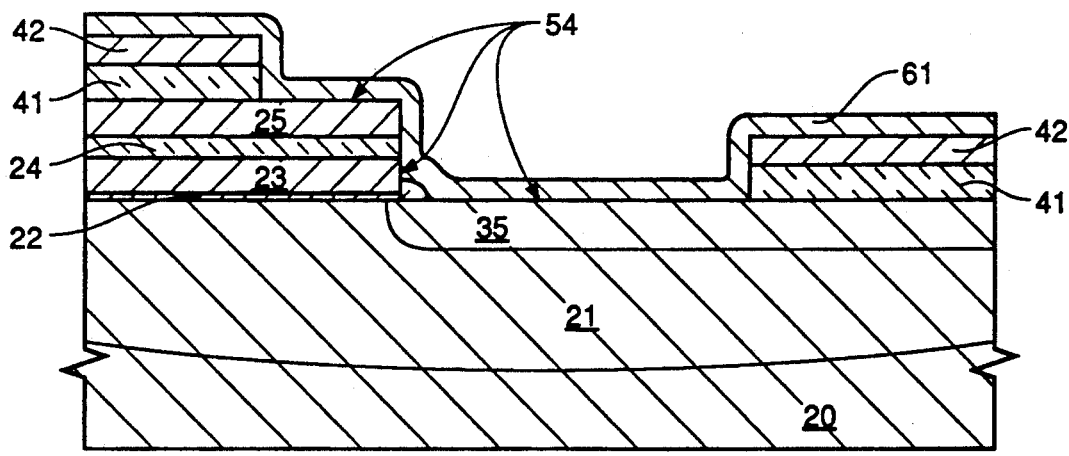

Referring now to FIGS. 5a and 5b, photoresist 51 (seen in FIGS. 4a and 4b) has been stripped and a thin layer of conformal poly 61 is deposited. Afterwards, subsequent annealing drives the p-type dopants, present in poly 42, and the n-type dopants, present in N+ diffusion region 31 and 35, P-channel poly 25 and NMOS poly gate 23, into poly 61, thereby forming intrinsic contacts at locations 52, 53 (FIG. 5a) and 54 (FIG. 5b). As mentioned in the process steps of FIG. 4b, a major portion of NMOS poly gate 23 being exposed allows for a solid connection between poly 61 and gate 23 after the anneal steps mentioned above are performed.

Figure 6A:
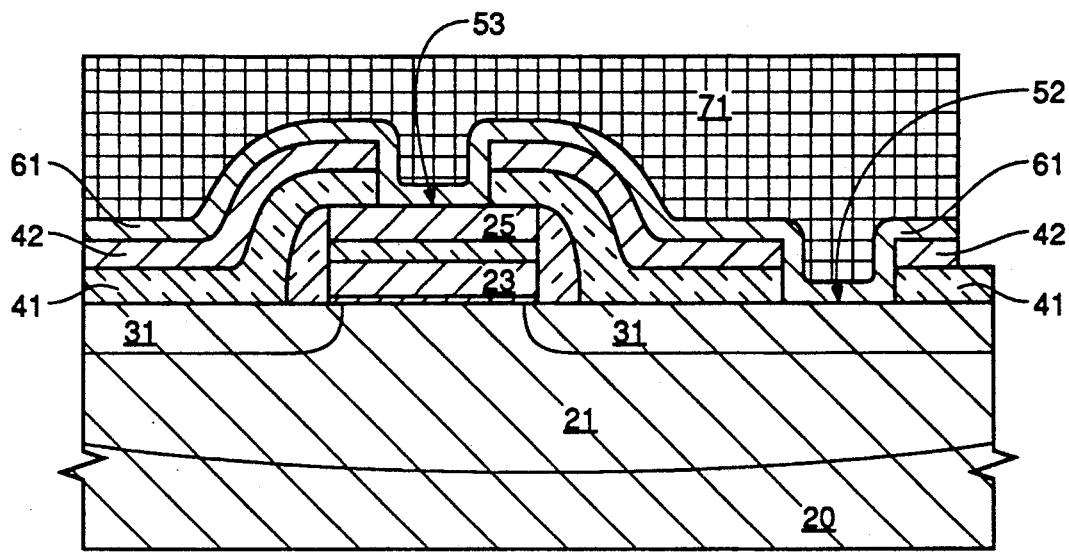
FIG. 6a shows a cross-sectional view of the in-process wafer portion of FIG. 5a after a second photomask etch step to define an active P-channel load of the present invention.
Figure 6B:
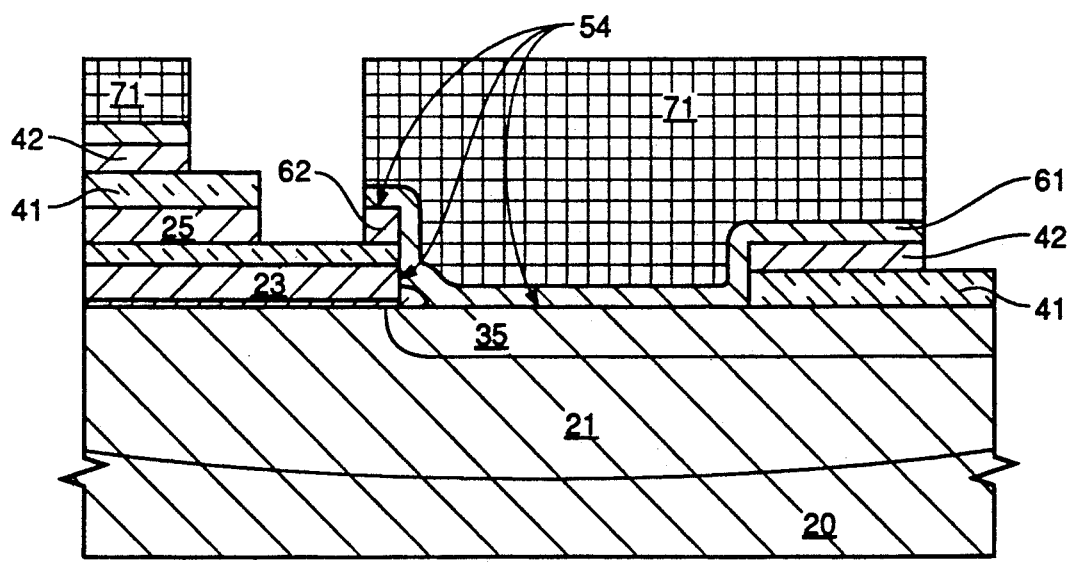
FIG. 6b shows a cross-sectional view of the in-process wafer portion of FIG. 5b after a second photomask etch step which defines a self-aligned buried contact.

Referring now to FIG. 6a, photoresist 71 is placed and patterned in order to pattern and etch poly 61 to define the low cost P-channel device comprising poly 61 making contact to N+ diffusion region 31 and to n-type conductively doped poly 25. As seen in FIG. 6b, during the same photomasking step of FIG. 6a, poly 25 is severed thereby leaving a poly portion 62 and poly 61 is patterned to make connection to diffusion region 35, P-channel poly 25 and NMOS gate poly 23.

Figure 7A:
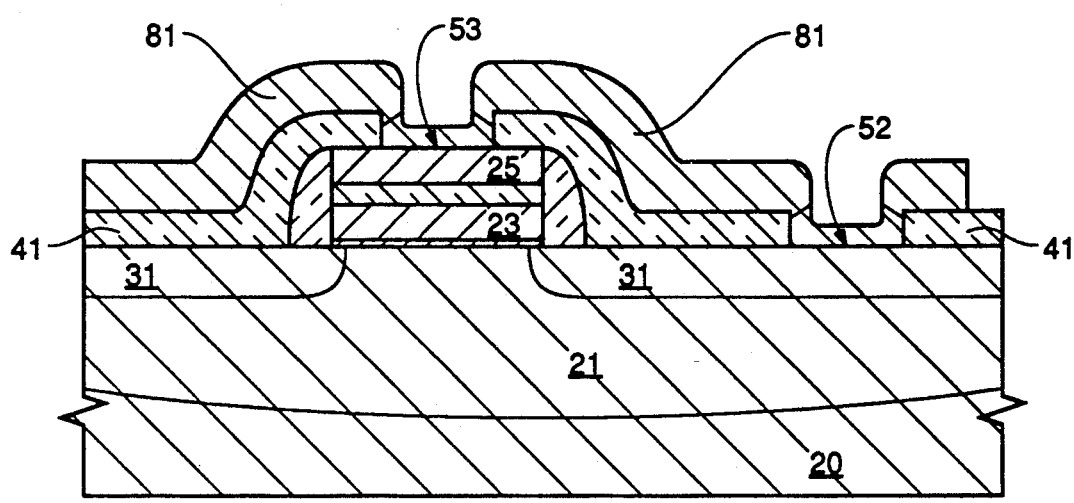
FIG. 7a shows a cross-sectional view of the in-process wafer portion of FIG. 6a after the photoresist is stripped thereby completing the active P-channel load of the present invention.
Figure 7B:
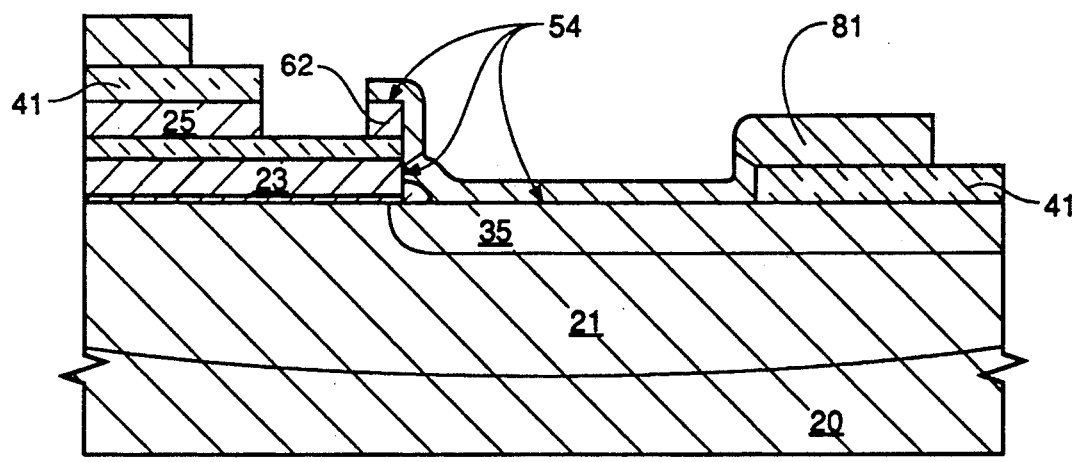
FIG. 7b shows a cross-sectional view of the in-process wafer portion of FIG. 6b after the photoresist is stripped thereby completing the self-aligned buried contact in an SRAM cell utilizing the present invention.

Referring now to FIGS. 7a and 7b, photoresist 71 (seen in FIGS. 6a and 6b) has been stripped leaving poly 81 which is a laminated poly layer comprising poly 61 and poly 42 (seen in FIGS. 6a and 6b) and thereby forms the completed P-channel load overlying an NMOS active (seen in FIG. 7a) and the self-aligned buried contact 54 coupling the present invention into a SRAM storage cell (seen in FIG. 7b). The P-channel may overlie the NMOS device directly or at some distance away as long as the gates of both devices are common to one another.

Figure 8:
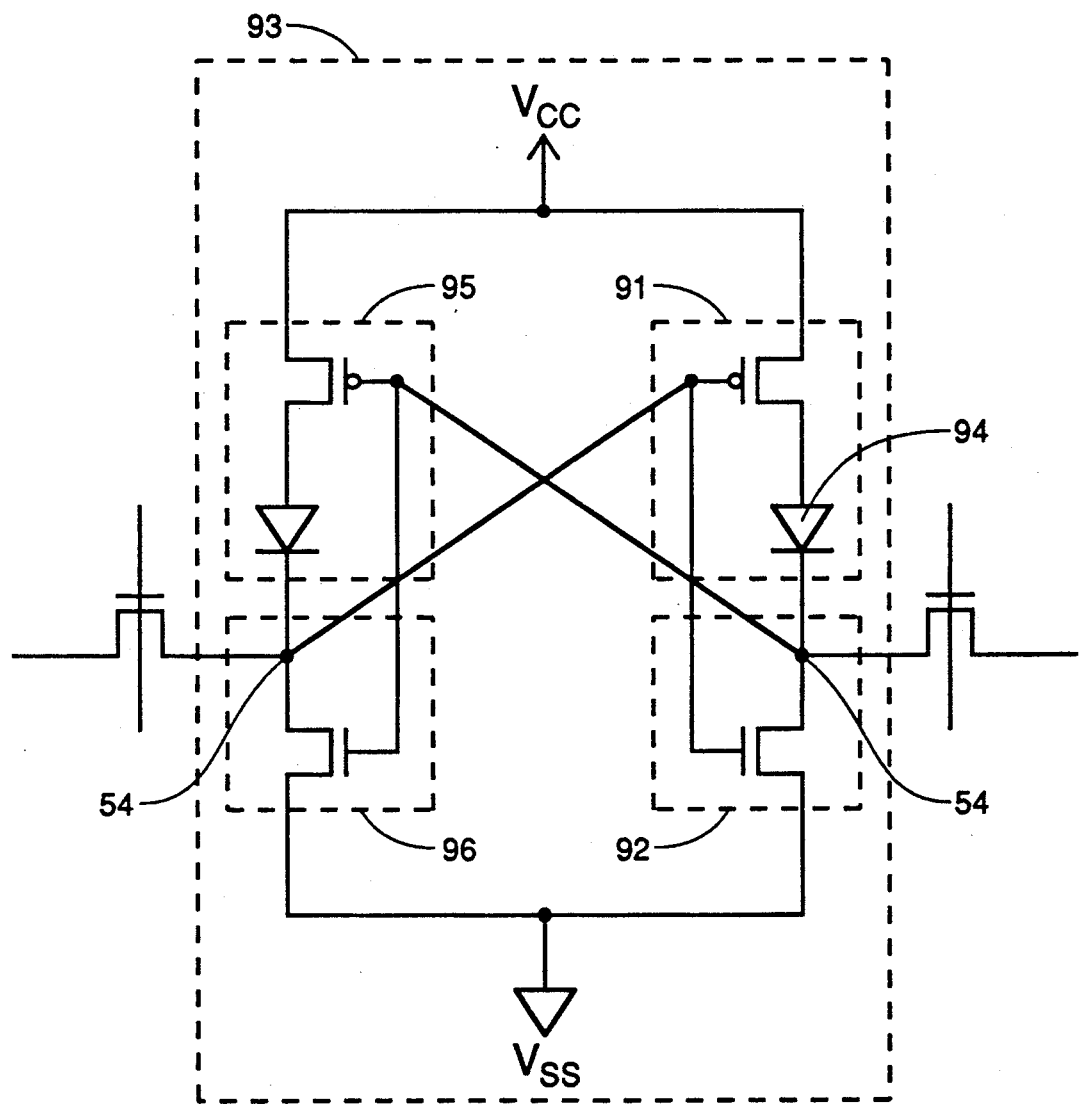
FIG. 8 is a schematic representation of an SRAM cell utilizing the present developed in FIGS. 1–7b.

FIG. 8 shows a schematic representation of an SRAM cell utilizing the P-channel active device and buried contact developed in the fabrication steps illustrated in FIGS. 1-7b. The low cost P-channel device 91 is shown drawn above NMOS active device 92, thereby making up one half of a static storage cell 93. The gates of both devices are connected together as are their drains. The source of p-channel device 91 is tied to $V_{cc}$ while the source of NMOS active device 92 is tied to $V_{ss}$. Forward biased parasitic diode 94 represents the coupling at node (contact) 54 between the drain of P-channel device 91, the source of NMOS device 92, and to the common gates of P-channel device 95 and NMOS device 96. The coupling at node 54 is contact 54 found in FIG. 7b that connects an adjacent replica of an active p-channel device and an NMOS device, whereby the drain (poly 81) of p-channel device 91 connects to the gate (poly 23) of NMOS device 96, to the gate (poly 25) of p-channel device 95 and to the drain (diffusion region 35) of NMOS device 92 (formed in the second half of the SRAM cell). P-channel devices 91 and 95 become active pullups for static cell 93.

As one skilled in the art would suspect, the conductivity types selected doping the substrate and poly layers could be reversed to create a low cost N-channel pulldown tied to an active PMOS device if so desired.

The process steps depicted in FIGS. 1-7b serve as an example for the use of the P-channel load of the present invention in an SRAM cell. However, one skilled in the art may easily incorporate the process steps of FIGS. 1-7a into an applicable CMOS fabrication process where active pullup or pulldown devices may be used.

Therefore, it is to be understood that although the present invention has been described with reference to first and second embodiments, various modifications, known to those skilled in the art, may be made to the structure and process steps presented herein without departing from the invention as recited in the several claims appended hereto.

I claim:

1. A structure of an active device combined with an active load, said structure constructed in a semiconductor device fabricated on a starting substrate, said structure comprising:

a) said active device having a control gate overlying a substrate portion of first type conductivity and separated therefrom by a gate dielectric layer, said control gate spanning between first and second diffusion regions conductively doped to a second type conductivity; and b) said active load having a lower channel semiconductive material portion of second type conductivity directly overlying and separated from said control gate by a first dielectric layer, an upper channel intrinsic semiconductive material portion aligning and connecting to said lower portion, first and second terminals of first type conductivity lying above said upper portion and extending downward to connect to either side of said upper portion thereby forming a u-shaped junction, said first terminal being separated from said active device's first diffusion region by a second dielectric layer and said second terminal connecting to said active device's second diffusion region at a contact location and separated elsewhere by said second dielectric layer.

2. The structure of claim 1, wherein said starting substrate is a silicon wafer.

3. The structure of claim 1, wherein said semiconductor device is a static random access memory.

4. The structure of claim 1, wherein said semiconductive material is polysilicon.

5. The structure of claim 1, wherein said first type conductivity is p-type and said second type conductivity is n-type.

6. The structure of claim 1, wherein said first type conductivity is n-type and said second type conductivity is p-type.

7. A semiconductor device fabricated on a starting substrate, having a structure comprising an active device combined with an active load, said structure comprising:
 a) said active device having a control gate overlying a substrate portion of first type conductivity and separated therefrom by a gate dielectric layer, said control gate spanning between first and second diffusion regions conductively doped to a second type conductivity; and
 b) said active load having a lower channel semiconductive material portion of second type conductivity directly overlying and separated from said control gate by a first dielectric layer, an upper channel intrinsic semiconductive material portion aligning and connecting to said lower portion, first and second terminals of first type conductivity lying above said upper portion and extending downward to connect to either side of said upper portion thereby forming a u-shaped junction, said first terminal being separated from said active device's first diffusion region by a second dielectric layer and said second terminal connecting to said active device's second diffusion region at a contact location and separated elsewhere by said second dielectric layer.

8. The structure of claim 7, wherein said starting substrate is a silicon wafer.

9. The structure of claim 7, wherein said semiconductor device is a random access memory.

10. The structure of claim 7, wherein said semiconductive material is polysilicon.

11. The structure of claim 7, wherein said first type conductivity is p-type and said second type conductivity is n-type.

12. The structure of claim 7, wherein said first type conductivity is n-type and said second type conductivity is p-type.

13. A structure comprising an active NMOS device combined with an active PMOS load, said structure constructed in a semiconductor device fabricated on a starting silicon substrate, said structure comprising:
 a) said active NMOS device having a control gate overlying a p-type silicon substrate portion and separated therefrom by a gate dielectric layer, said control gate spanning between source and drain regions; and
 b) said active PMOS load having a lower channel portion of n-type polysilicon material directly overlying and separated from said control gate by a first dielectric layer, an upper channel portion of intrinsic polysilicon material aligning and connecting to said lower channel portion, first and second terminals of p-type polysilicon lying above said upper channel portion and extending downward to connect to either side of said upper channel portion thereby forming a u-shaped junction, said first terminal being separated from said active NMOS device's source region by a second dielectric layer and said second terminal connected to said active NMOS device's drain region at an intrinsic contact location and separated elsewhere by said second dielectric layer.

14. The structure of claim 13, wherein said semiconductor device is a static random access memory.

15. A static random access semiconductor device fabricated on a silicon substrate, having a structure comprising an active NMOS device combined with an active PMOS load, said structure comprising:
 a) said active NMOS device having a control gate overlying a p-type silicon substrate portion and separated therefrom by a gate dielectric layer, said control gate spanning between source and drain regions; and
 b) said active PMOS load having a lower channel portion of n-type polysilicon material directly overlying and separated from said control gate by a first dielectric layer an upper channel portion of intrinsic polysilicon material aligning and connecting to said lower channel portion, first and second terminals of p-type polysilicon lying above said upper channel portion and extending downward to connect to either side of said upper channel portion thereby forming a u-shaped junction, said first terminal being separated from said active NMOS device's source region by a second dielectric layer and said second terminal connected to said active NMOS device's drain region at an intrinsic contact location and separated elsewhere by said second dielectric layer.

* * * * *